(12) United States Patent
Rick et al.

(10) Patent No.: US 6,187,160 B1
(45) Date of Patent: Feb. 13, 2001

(54) APPARATUS FOR THE COATING OF SUBSTRATES IN A VACUUM CHAMBER

(75) Inventors: Alfred Rick, Kahler; Helmut Eberhardt, Schneidweg; Klaus Michael, Schöne; Jörg Krempel-Hesse, Espenweg, all of (DE)

(73) Assignee: Leybold Systems GmbH, Hanau (DE)

( * ) Notice: Under 35 U.S.C. 154(b), the term of this patent shall be extended for 0 days.

(21) Appl. No.: 09/334,499

(22) Filed: Jun. 17, 1999

(30) Foreign Application Priority Data

Jun. 19, 1998 (DE) ................................ 198 27 461

(51) Int. Cl.$^7$ .................................................. C23C 14/00
(52) U.S. Cl. ................... 204/298.22; 204/298.2; 204/298.21
(58) Field of Search ..................... 156/345, 643; 118/723 R; 204/298.16, 298.2, 298.22, 298.31, 298.21

(56) References Cited

U.S. PATENT DOCUMENTS

| | | | |
|---|---|---|---|
| 4,252,626 | 2/1981 | Wright et al. | 204/192 R |
| 5,308,417 | * 5/1994 | Groechel et al. | 156/643 |
| 5,332,590 | * 7/1994 | Koshimizu | 156/626 |
| 5,531,862 | * 7/1996 | Otsubo et al. | 156/643.1 |
| 5,717,294 | * 2/1998 | Sakai et al. | 315/111.41 |

FOREIGN PATENT DOCUMENTS

| | | |
|---|---|---|
| 123952 | 1/1977 | (DE) . |
| 3506227 | 10/1985 | (DE) . |
| 0 045 822 | 2/1982 | (EP) . |
| 0 376 017 | 7/1990 | (EP) . |
| 0 525 295 | 2/1993 | (EP) . |
| 0 537 012 | 4/1993 | (EP) . |

* cited by examiner

*Primary Examiner*—Paul Thibodeau
*Assistant Examiner*—Monique R. Jackson
(74) *Attorney, Agent, or Firm*—Smith, Gambrell & Russell, LLP

(57) ABSTRACT

An apparatus is disclosed for the coating of substrates (10) with thin films, having a vacuum chamber (1), a target (6) to be atomized, situated opposite the substrate (10) in the vacuum chamber (1), with magnets (19, 19', 19"; 20, 20', 20") to produce a magnetic tunnel in front of the area of the target (6) to be atomized, an inlet (8) for a process gas into the process space (11), an anode (12), which is electrically insulated with respect to the vacuum chamber (1), and a current-voltage supply to produce a plasma in front of the target (6). The target (6) is shaped as a rotation-symmetrical body, which provides a ring-shaped enclosure around the substrate (10), wherein the magnets (19,19', . . . ; 20,20', . . . ) are supported on the side of the hollow cylindrical target (6), facing away from the substrate (10), and can move around the rotational axis (R) of the target (6). The substrate (10) is electrically insulated, with respect to the vacuum chamber (1), and a part of an insulator (13), configuring the anode (12), is supported on the bottom of the process space (1).

4 Claims, 1 Drawing Sheet

APPARATUS FOR THE COATING OF SUBSTRATES IN A VACUUM CHAMBER

INTRODUCTION AND BACKGROUND

The present invention relates to an apparatus for the coating of substrates with thin films in a vacuum chamber having a target to be atomized, located opposite the substrate in the vacuum chamber, with magnets for the creation of a magnetic tunnel in front of the target area to be atomized. An inlet is provided for introducing a process gas into the vacuum chamber. The apparatus further includes an anode insulated electrically with respect to the vacuum chamber, and a current-voltage supply to create a plasma in front of the target.

A device is known for the carrying out of vacuum-technique processes in magnetic field-reinforced electrical discharges consisting of a magnet field-producing device and a target with a negative potential and an anode, between which the electrical discharge burns, see DD 123 952. In that device, the magnetic field-producing device with its pole shoes is shaped annularly and concentrically to the cathode and in accordance with the vacuum-technique process to be carried out, is located in the interior of the tubular target or around the outside. This arrangement produces inhomogeneous, torus-shaped magnetic fields, limited in the axis direction, whose main field direction in the area of the target is directed parallel to its axis direction. The anode surrounds the target tubularly with the placement of the magnetic field-producing device in the target, and when placed around the target, is situated in it as a tube or full material, wherein the magnetic field-producing device, the tubular target, and the anode can move relative to one another.

Also known is a device for high-rate atomizing according to the plasmatron principle; see DD 217 964 A3. This device includes a magnetic field-producing device with an annular slot, a cooled tubular target, and an anode, wherein the magnetic-producing device has a longitudinally extended annular slot, which is, in fact, closed, in which the target is located in such a manner that its large axis runs parallel to the target axis. The anode surrounds the target in such a manner that the annular slot area is free, and by means of an adjusting device, the distance between the anode and the target surface can be adjusted to a fixed value. To produce a relative movement around the large axis, a drive is situated between the target and the magnetic field-producing device, and a device to change the distance between it and the target is located on the magnetic field-producing device.

Still further, from EP 0461 035 B1 is known a cathode for vacuum atomizing comprising a hollow body, essentially in the form of a rotary body, which can rotate around its axis, with a side wall, which extends along the axis, and two front sides, essentially vertical to the axis, wherein the hollow body is formed from material to be atomized, at least on the exterior of its side wall. There is a magnetic circuit for the magnetic enclosure, which is provided close to a target, and poles, parts made of magnetic-permeable metal and magnetizing agents, which are suitable for the production of a magnetic flux in the magnetic circuit. Included is a device for connection with a cooling circuit for the circulation of a cooling liquid in the hollow body, and a device for connection with an electric supply circuit. A driving device serves to rotate the hollow body around an axis, wherein the magnetic circuit extends peripherally with reference to the hollow body. The magnetizing agent is provided outside the body; and the poles of the magnetic circuit are provided along two generatrices of this hollow body, and an arc of the side wall for the hollow body, which is located between these two generatrices, forms the target of the cathode.

Finally, a device for the atomization of thin films of a selected coating material on essentially planar substrates has already been proposed (EP 0 070 899 B1), consisting of an evacuatable coating chamber, and a cathode affixed horizontally in this coating chamber, with an elongated, cylindrical tube element, on whose exterior surface, a layer of the coating material to be atomized is applied. Magnetic agents are placed in this tube element so as to provide an atomizing zone extending from it in the longitudinal direction. Devices to rotate this tube element around its longitudinal axis are provided, so as to bring various parts of the coating material into an atomizing position opposite the aforementioned magnetic agents and within the aforementioned atomizing zone and with agents located in the coating chamber for the horizontal support of substrates and for their transportation past the magnetic agents, so that they receive substrates of the atomized material.

An object of the invention is to create a device of the type described above, which ensures a particularly high target utilization and simultaneously, makes possible a high coating rate, so as to be able to coat individual substrates at a high throughput.

SUMMARY OF THE INVENTION

The above and other objects of the present invention can be achieved by shaping the target as a rotation-symmetrical body and which surrounds the substrate annularly, and placing magnets on the outside of the hollow cylindrical target which faces away from the substrate and which can rotate around the longitudinal axis of the target. In this way, the substrate is insulated electrically with respect to the vacuum chamber and a part of an insulator, forming an anode, and is supported on the bottom of the vacuum chamber.

BRIEF DESCRIPTION OF DRAWINGS

The present invention will be further understood with reference to the accompanying drawings wherein.

DETAILED DESCRIPTION OF INVENTION

Figure 1:
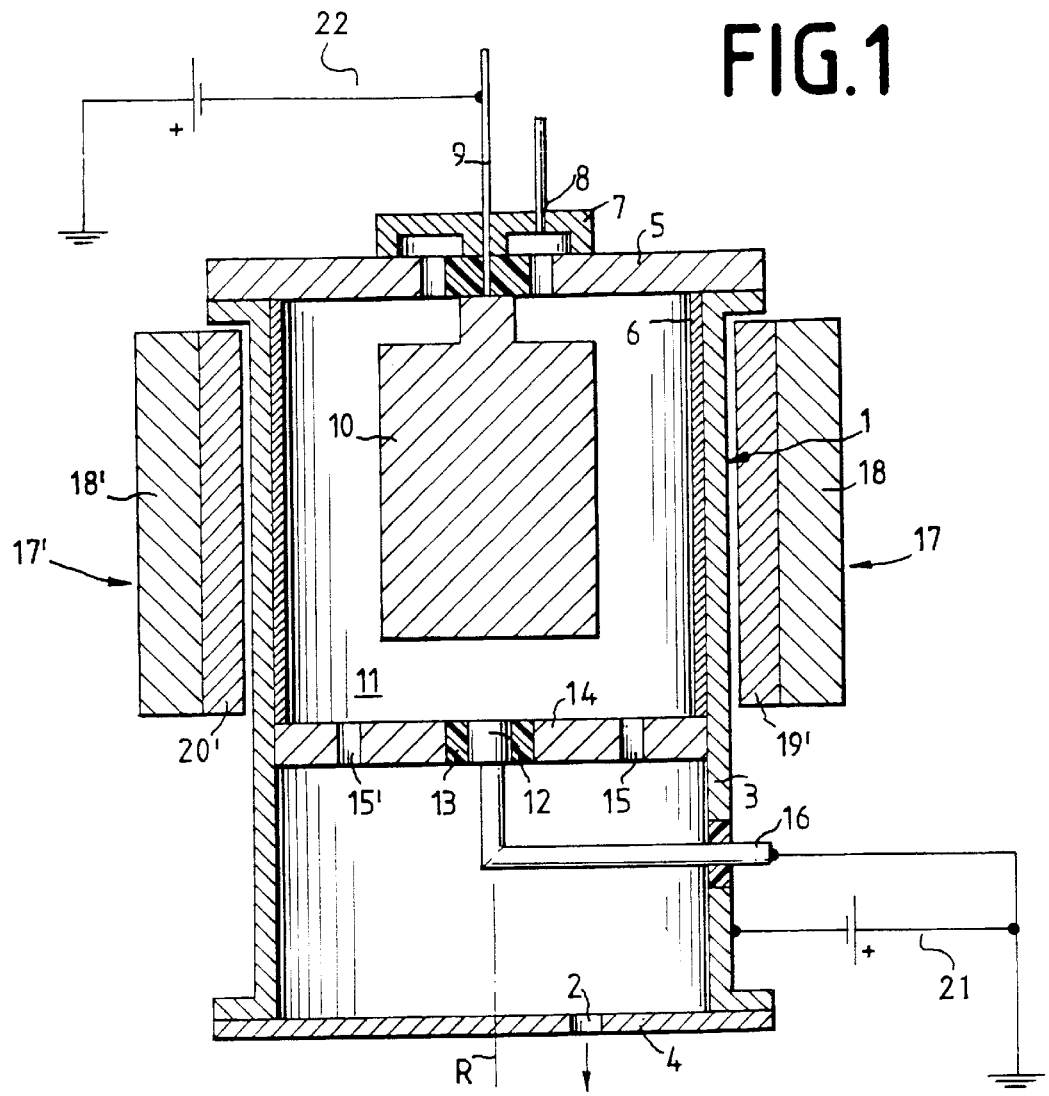
FIG. 1 is a schematic representation of an apparatus in longitudinal section.
Figure 2:
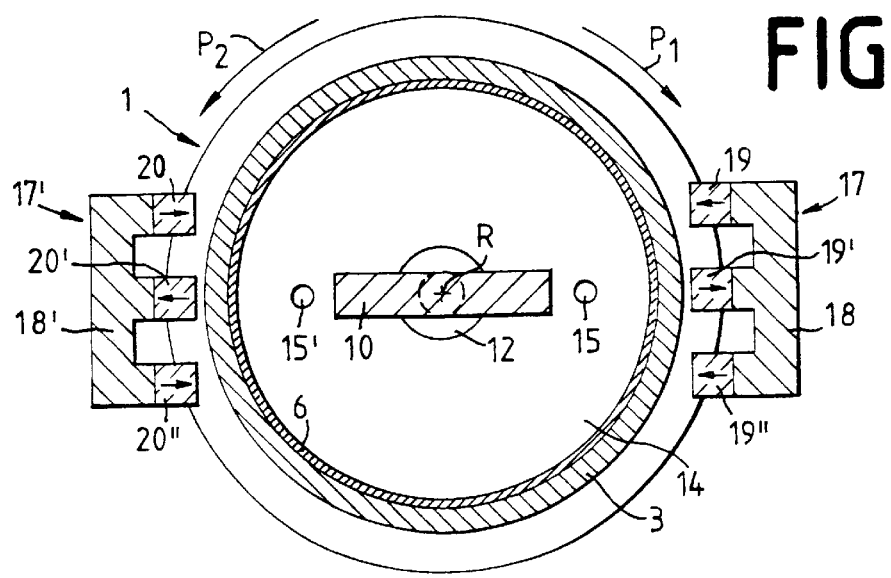
FIG. 2 is a schematic representation of an apparatus in cross section.

The present invention will now be described in further detail with reference to the accompanying drawings. The apparatus essentially consists of a hollow cylindrical housing 3 with a circular disk-shaped bottom piece 4 with a suction pump connection 2, provided in the surface thereof of permit evacuation of the interior chamber space 11 contained within the housing 3. The apparatus can be made from any conventional metal customarily used in this art. Bottom piece 4 conforms with the dimensions of the bottom of the apparatus. At the top of chamber 11 there is located a likewise approximately circular disk-shape lid 5 conforming to the outer dimensions the chamber 11. A hollow cylindrical target 6 lines the interior of the chamber 11 and conforms to the interior dimensions thereof. An insulator 7 with processing gas inlet connections 8, and the lead for an electrical connection line 9 fits over the top of lid 5. A current-voltage supply 22 is connected to the lead for an electrical connection line 9. Any conventional processing gas known in this art can be used. The substrate 10 is supported by the insulator 7 in the vacuum chamber 1. An intermediate floor 14 with openings 15,15', supports an anode 12 with an insulator ring 13. An electrical feed line 16 is connected to the anode 12 and a current-voltage supply 22 is connected to the electrical feed line 16. The two magnet sets 17,17', can be rotated around the longitudinal axis R (in the direction of the arrow $P_1$ or $P_2$), which are formed from a magnet yoke 18,18', and permanent magnets 19,19', ... or 20,20', ... with different polarities.

During the coating method, the magnet sets 17,17' rotate around the hollow cylindrical part of the vacuum chamber 1, wherein a plasma burns in the process space 11 between the substrate 10 and the target 6 and the sputtered particles move radially inwards to the substrate 10 from the interior surface of the target. Any suitable target material can be used to form the target 6.

Further variations and modifications will be apparent to those skilled in the art from the foregoing and are intended to be encompassed by the claims appended hereto.

German priority application 198 27 461.0 is relied on and incorporated herein by reference.

We claim:

1. An apparatus for the plasma technique coating of a substrate with a thin film, comprising:

a vacuum chamber having a process space;

a target to be atomized, situated opposite a substrate in the vacuum chamber;

a plurality of magnets for producing a magnetic tunnel in front of an area between the substrate and the target to be atomized;

an inlet for entry of a process gas into the process space;

an anode which is electrically insulated with respect to the vacuum chamber, and at least one current-voltage supply to produce a plasma in front of the target, wherein the target is shaped as a rotation-symmetrical body, a ring-shaped enclosure is formed around the substrate, the plurality of magnets are supported outside of the hollow cylindrical target, and are movable around a rotational axis of the target, wherein the substrate is electrically insulated, with respect to the vacuum chamber, and the magnets form two magnet sets placed opposite to each other diametrically with respect to the rotational axis.

2. The apparatus according to claim 1 further comprising an insulator surrounding said anode located in said process space.

3. The apparatus according to claim 1 further comprising an intermediate floor located in said process space for holding said anode.

4. The apparatus according to claim 3 wherein said target extends from a top of said process space to said intermediate floor.

* * * * *